US010122963B2

(12) United States Patent
Wall et al.

(10) Patent No.: US 10,122,963 B2
(45) Date of Patent: Nov. 6, 2018

(54) BIDIRECTIONAL AUDIO/VIDEO: SYSTEM AND METHOD FOR OPPORTUNISTIC SCHEDULING AND TRANSMISSION

(71) Applicant: Milestone AV Technologies LLC, Eden Prairie, MN (US)

(72) Inventors: Tim Wall, Big Lake, MN (US); Roger Holschbach, Blaine, MN (US)

(73) Assignee: Milestone AV Technologies LLC, Eden Prairie, MN (US)

( * ) Notice: Subject to any disclaimer, the term of this patent is extended or adjusted under 35 U.S.C. 154(b) by 0 days.

(21) Appl. No.: 13/960,113

(22) Filed: Aug. 6, 2013

(65) Prior Publication Data

US 2014/0362171 A1 Dec. 11, 2014

Related U.S. Application Data

(60) Provisional application No. 61/833,555, filed on Jun. 11, 2013.

(51) Int. Cl.
*H04N 7/14* (2006.01)
*H04N 7/15* (2006.01)

(52) U.S. Cl.
CPC ............. *H04N 7/147* (2013.01); *H04N 7/15* (2013.01); *H01L 2224/48137* (2013.01); *H01L 2224/49175* (2013.01)

(58) Field of Classification Search
CPC .................................. H04N 7/147; H04N 7/15
See application file for complete search history.

(56) References Cited

U.S. PATENT DOCUMENTS

| 5,253,249 | A | 10/1993 | Fitzgerald et al. |
| 5,412,688 | A * | 5/1995 | Marbot .................. H03K 5/026 327/77 |
| 5,550,589 | A * | 8/1996 | Shiojiri et al. ............. 348/386.1 |
| 5,579,336 | A | 11/1996 | Fitzgerald et al. |
| 5,719,786 | A | 2/1998 | Nelson et al. |
| 6,567,984 | B1 | 5/2003 | Allport |
| 7,912,045 | B2 | 3/2011 | Page |
| 8,860,774 | B1 | 10/2014 | Sheeley et al. |
| 2003/0045285 | A1* | 3/2003 | Parkman ............ H04B 7/18508 455/428 |
| 2003/0048353 | A1 | 3/2003 | Kenoyer et al. |
| 2003/0196208 | A1* | 10/2003 | Jacobson ...................... 725/116 |

(Continued)

OTHER PUBLICATIONS

Nov. 13, 2014 PCT Search Report (Serial No. PCT/US14/36482).

(Continued)

*Primary Examiner* — Rina C Pancholi

(74) *Attorney, Agent, or Firm* — Patterson Thuente Pedersen, P.A.

(57) ABSTRACT

A bidirectional transceiver includes a media transmitter, a media receiver, a network transmitter, and a network receiver. Each of these components includes an interface to a respective differential wire pair of a cable. By coupling a pair of such transceivers, a media stream and network connectivity can be sent over the cable in either or both directions. Using an opportunistic scheduling method, each media stream can contain audio, video, and control information in uncompressed form. Power can be transferred over the cable so that a media device containing one transceiver can be powered by a media device containing the other transceiver.

36 Claims, 11 Drawing Sheets

(56) References Cited

U.S. PATENT DOCUMENTS

| | | | |
|---|---|---|---|
| 2004/0041902 A1* | 3/2004 | Washington | 348/14.01 |
| 2004/0119814 A1 | 6/2004 | Clisham et al. | |
| 2004/0160971 A1* | 8/2004 | Krause et al. | 370/412 |
| 2006/0209892 A1 | 9/2006 | MacMullan et al. | |
| 2007/0143811 A1* | 6/2007 | Powell | 725/127 |
| 2009/0061841 A1 | 3/2009 | Chaudhri et al. | |
| 2010/0118111 A1 | 5/2010 | Bouazizi | |
| 2011/0096138 A1 | 4/2011 | Grimshaw | |
| 2011/0302334 A1* | 12/2011 | Ponnatota | H04L 12/40136 710/30 |
| 2011/0317587 A1* | 12/2011 | Lida et al. | 370/254 |
| 2013/0058593 A1 | 3/2013 | Kanalakis, Jr. et al. | |
| 2013/0097333 A1 | 4/2013 | Bathurst et al. | |
| 2013/0147902 A1* | 6/2013 | Weiser | H04N 7/15 348/14.08 |
| 2013/0155170 A1 | 6/2013 | Eichen et al. | |
| 2013/0293670 A1 | 11/2013 | Ayoub et al. | |
| 2014/0160225 A1 | 6/2014 | Baldelli et al. | |
| 2014/0168355 A1 | 6/2014 | Pillarisetty et al. | |

OTHER PUBLICATIONS

Sep. 25, 2014 PCT Search Report (Serial No. PCT/US14/36483).
Dec. 3, 2013 USPTO Office Action (U.S. Appl. No. 13/960,066).
Apr. 3, 2014 USPTO Office Action (U.S. Appl. No. 13/960,066).
Mar. 16, 2015 USPTO Office Action (U.S. Appl. No. 14/340,615).
Feb. 7, 2015 USPTO Office Action (U.S. Appl. No. 14/340,615).
Feb. 1, 2015 USPTO Office Action (U.S. Appl. No. 14/340,615).
PreSonus, Digital Audio Connections and Synchronization, 2010, http://www-media-presonus.netdna-ssl.com/uploads/news/media/files/digital_connections_and_sync.pdf.
S/PDIF (Sony/Philips Digital Interface), http://whatis.techtarget.com/definition/S-PDIF-Sony-Philips-Digital-Interface, Last Updated Oct. 2008.
SPDIF, http://www.tech.faq.com/spdif.html, Printed Dec. 9, 2015.

\* cited by examiner

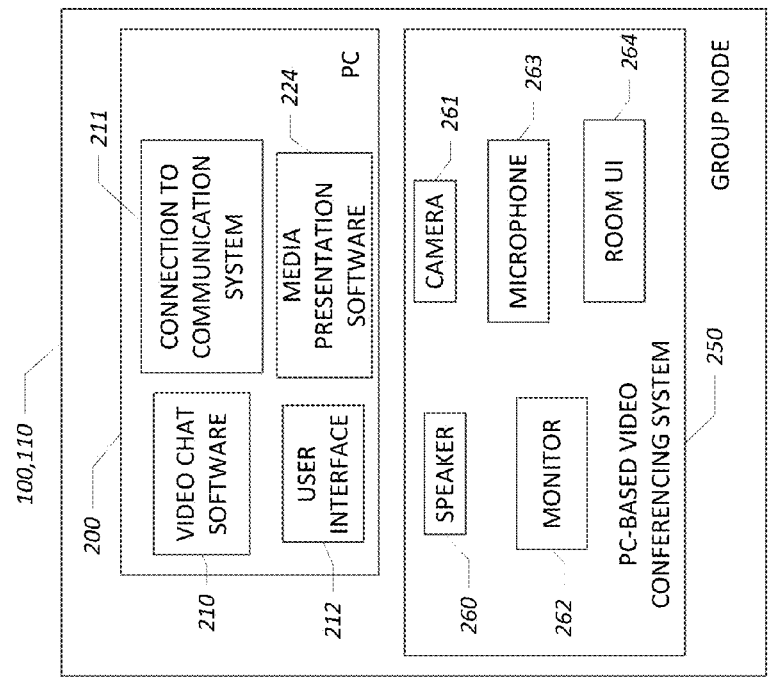
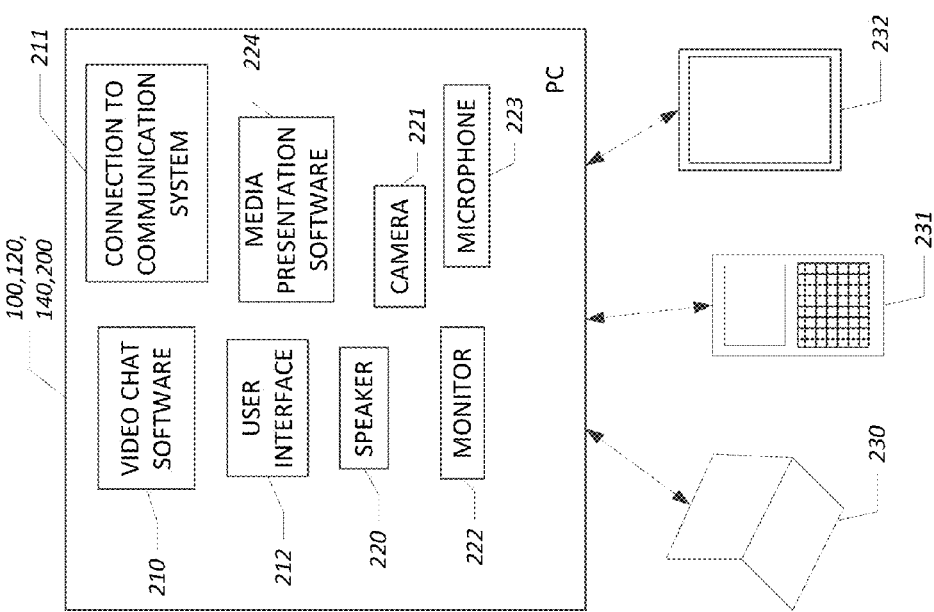
FIG. 2b
FIG. 2a

_US 10,122,963 B2_

BIDIRECTIONAL AUDIO/VIDEO: SYSTEM AND METHOD FOR OPPORTUNISTIC SCHEDULING AND TRANSMISSION

CROSS-REFERENCES TO RELATED APPLICATIONS

This application claims the benefit of U.S. Provisional Application No. 61/833,555, filed Jun. 11, 2013, and entitled "System and Method for PC-Based Video Conferencing and Audio/Video Presentation", which is hereby incorporated by reference. This application is related to U.S. Utility Application No. 13/960,066(now U.S. Pat. No. 8,860,774), filed Aug. 6, 2013, and entitled "System and Method for PC-Based Video Conferencing and Audio/Video Presentation", which is hereby incorporated by reference.

FIELD OF THE INVENTION

The present invention relates to bidirectional transmission of audio and video streams between a pair of media appliances. More specifically, it relates to bidirectional transmission in which sequencing of data types is done opportunistically.

BACKGROUND OF THE INVENTION

Software that facilitates real time audio and video conversation between two individuals over a communication system is well-known. The communication system may be, for example, the Internet, a local area network, a telephone network, or some combination of communication systems. Typically, each individual executes a respective copy of the same video chat software program on a personal computer or other smart device, such as a cell phone, a tablet computer, a portable media player, or an e-reader. We will refer to such devices, which include a processor and an operating system, collectively as "computers" or "PCs".

Individuals participating in a video chat session may use the same type of PC, or different types, so long as each PC implements a version of chat software that is compatible with the others. A video stream may be captured by a webcam built into, or coupled with, the PC; an audio stream, by a microphone, either external from, or internal to, the PC. The other participant(s) receive that video and typically display it on a screen that is built into their PC. They listen to the audio using one or more PC speakers, external speakers, or a headset. Text messaging capability and other capabilities, such as file transfer and clickable hyperlinks, are often facilitated by the software. Examples of such software, which we will refer to as "video chat software", include Skype®, Yahoo!® Messenger, and Google Voice™. Such video chat software is available to the public for immediate download from the Internet, at little or no cost.

Some modern video chat software is not limited to two participating PCs. When the software enables three or more participants, each participant may be able to see each of the other participants simultaneously in separate windows on a split screen, or may be able to toggle among windows displaying the individual participants.

We will use the term "real-time" in connection with audio and video stream transmission by video chat software. Although no transmission is actually instantaneous, by "real-time" or "instantaneous" we mean without systematic delay significant enough as to be noticeable by most people.

SUMMARY OF THE INVENTION

Inexpensive or free video chat software directed toward individual participants is widely used. Two or more people can agree on a video chat software package, and if they do not already have the software installed on their PC, they can typically download it from the Internet, install it, and be video and audio chatting within minutes.

PC webcams, microphones, speakers, and displays are typically designed for use by a single individual who is operating the PC at the time. But in business contexts, a common scenario is a meeting in a conference room, with one or more individuals, who cannot be physically present, participating by conference phone. Two remotely-located companies, each with its own conference room containing several individuals, may engage in some negotiation over a chat facility. A family may gather in a room to chat with one or more relatives based overseas. A student might need to participate in a class meeting while off campus.

Consider, as a particular example, the human resources (HR) department of a company, which routinely interviews applicants, from a national or global pool, for job openings. The company wants to conduct preliminary interviews of remote applicants in order to select a short list who will be flown to company headquarters for more in-depth interviews. On a moment's notice, the company would like to gather stake-holders in the hiring decision (e.g., the prospective boss, internal clients, co-workers, and an HR representative) in a conference room, and meet each of the remote candidates face-to-face.

From the perspective of a candidate, for this to be feasible over the Internet, the candidate must have access to hardware and software that facilitates video conferencing. For this to be affordable, access to these resources must be free, or at no cost to the candidate or to the company. For this to be timely, access by the candidate to these resources must be effectively immediate. For this to be workable from the perspective of the interviewers, the group node must have audio and video capabilities that are adequate for several people gathered in the conference room and speaking from their individual seats without passing a microphone around.

A solution is to use a PC executing ubiquitous video chat software such as Skype®, but, in the group node, effectively replace the microphone, camera, speaker, and/or display devices of the PC with equipment that is adequate for a conference room environment. Virtually every candidate will already own, or have access to, a PC that can run video chat software. If they do not have compatible software already installed, they may be able to download and install it for free, in minutes.

The company does not need to pay for expensive video conferencing software or special communication equipment. They can simply use an existing PC, supplemented with a system to couple that PC with peripheral devices more appropriate for a group environment. A conference room could be equipped for video conferencing almost instantly, using an existing PC running chat software, using concepts of the invention. In the negotiation scenario mentioned above, the two company teams can each participate using the same approach. Video chat software may facilitate two or more nodes. Using the concept of the invention, each node can be an individual node or a group node.

Such advantages may be achieved with a system that includes a PC docking station (dock) and a room media unit (RMU), coupled to each other by a communication system. The dock includes interfaces for connecting or communicating with a PC, whereby audio, video, and/or control streams, and/or network access may be exchanged between the PC and the dock. The dock may include a microphone, which might be part of a speakerphone. The speakerphone may include an interface for connection to a telephone communication system. The dock may include a bridge that provides the PC with pass-through access to the telephone system. The microphone (mic) is used to capture sound from the room, such as speakers' voices, to transmit to remote individual and group "nodes" via the video chat software. The mic may employ echo cancellation technology. The dock may include a tactile user interface for control of the system; the dock may include a display, which might be a touch display.

In many cases, organizations (e.g., companies and educational institutions) allow their PCs to connect to the Internet only through the organization's internal local network. Thus, the dock may provide an interface for pass-through of a network connection, such as the Internet or a local area network, to a connected PC.

The RMU includes a housing, and may or may not include one or more mounting mechanisms, such as brackets, hooks, wires, eye hooks, or mounting plates, adapted to attaching the housing to a wall; if so, the RMU may be referred to as a "wall unit." The RMU might alternatively be used without wall mounting; for example, resting on a bookcase or a filing cabinet.

The RMU may include, or be coupled to, a video camera to capture local video to be transmitted to the remote nodes. Preferably, the camera will at least have the capability to cover a wide field-of-vision angle (e.g., at least 70 degrees, or at least 80 degrees) sufficient to cover relevant portions of a room, such as the people at a conference table. One or more video cameras may be incorporated into the RMU housing; one or more video cameras may be external to the RMU housing, but controlled at least in part by logic in the RMU. If more than one camera are part of the system, they may complement each other in functionality, and each may be chosen to operate with any desired degree of "intelligence".

The RMU may contain, or be coupled with, one or more speakers, preferably ones of significantly better quality than those that today commonly come installed in laptop computers. When the system is used in a conference mode, the speakers output to the room sound received from the remote nodes. When the system is used in a presentation mode, the speakers may output the voice of a presenter.

The RMU may have an interface to communicate with one or more monitors or televisions, or it might include a monitor(s) or television(s) internally. A "monitor" might be a screen onto which a video stream is projected. When the system is used in a video conferencing mode, the monitor/TV outputs to the room video received by the PC from the video chat software. When the system is used in a presentation mode, the monitor may show the speaker's image and/or presentation content, such as a video or a slideshow.

Communication between the dock and the RMU may use any system, wired or wireless—any audio/visual (A/V) "pipe" capable of transmitting and receiving audio, video, and control information as required for the combined functionality of the dock and the RMU. Preferably, such communication will be based on a single cable, such as an inexpensive, off-the-shelf cable such as CAT 5, CAT 6, or CAT 7 cable. The dock and RMU may reformat the audio, video, and control information for transmission through the dock-RMU communication system, or "audio/visual (A/V) pipe". The dock and RMU may packetize information to be sent through the pipe. They may prioritize information (e.g. by type—audio, video, or control) to be sent through the pipe. They may intersperse packets of different types, and use information stored within the packets (e.g., a packet header) to synchronize and restore the original audio and video streams (or something very close to the original streams) in real time (see definition above). They may exchange audio and video information in uncompressed form.

A pair of transceivers might be used to perform the packetizing and scheduling functions of the dock and RMU. A configuration for a pair of bidirectional transceivers is described below. As will be clear from that description, these transceivers have much wider applicability than dock-RMU communication.

Embodiments of the bidirectional transceivers might be incorporated into any pair of media appliances; the dock and RMU are illustrative appliances. The transceivers may transmit and receive audio, video, control streams, and/or network information over a cable, such as CAT 5, CAT 6, or CAT 7, in either or both directions. Other cable types may also be used for the A/V pipe; preferably, they will have transmission speeds in both directions at least as fast as CAT 5, and have an architecture that incorporates at least four differential pairs of wires. Compromises may be made in audio resolution, video resolution, and/or frame rate to accommodate slower cable architectures. CAT 6 can handle 60 frames/s video, combined with audio and control streams. Since cinema is generally presented at only 24 frames/s, some compromise of the 60 frame rate can be made without noticeable degradation in video quality. Two differential pairs may carry media content in both directions, and two differential wire pairs may carry network access in both directions. The media content may include packetized and combined audio and video streams; the media content may also include control data for exchanging control or status information between the media appliances. The two network pairs may also be used to carry electrical power from one of the appliances to the other.

To carry media (audio and video, and possibly control) streams from a source device (e.g. a PC) to a destination device (e.g., a speaker or a monitor), one transceiver will act as transmitter; the other, receiver. The transmitter may include reformatter logic (i.e., hardware, or software instructions that are accessed from tangible media and executed by a processor or processing system), that reformats media information for transmission through the pipe; packetizer logic that create packets which incorporate data (e.g., packet headers), thereby allowing the packets to be later converted back into streams; adaptive rate multiplexer logic, which sequences and assembles the packets into an integrated media stream; and a transport layer, to provide physical interfaces of transmitter elements to a CAT 6 or other cable interface.

The receiving transceiver may include a transport layer, to couple CAT 6 or other cable interface to physical interfaces of receiver elements; adaptive rate demultiplexer logic, which disassembles the integrated media stream into packets, and then resequences the packets for reconstruction into the separate audio, video, and control streams; depacketizer logic, that removes headers from the packets and extracts the audio, video, and control information from the packets; reclocker logic to reconstruct the timing and synchronization of the audio and video streams; and reformatter logic to convert the stream formats if necessary for transmission to the destination.

A given transceiver may combine some or all of the transmitting and receiving functionality. Preferably the transceiver will be fully bidirectional, implementing all functionality for both simultaneously transmitting and receiving. Some elements executing particular logic functions may be hardware components; some logic functions may be dispersed over two or more hardware components; and one hardware component may perform two or more logic functions. Henceforth, when we refer to a component such as a "multiplexer", the reader should understand that to mean multiplexer logic, which might or might not correspond to a single hardware component.

The adaptive rate multiplexer may prioritize which type of information gets inserted next into the media stream. For example, in order of decreasing priority: audio, control, and video; in other words, video packets will only be inserted when there are no audio or control packets to insert. Audio preferably has the highest priority because errors or offsets in audio are typically most noticeable to humans. Other prioritization schemes are, of course, possible. We call such prioritization of bandwidth "opportunistic sequencing" of packets when building the integrated media stream.

Opportunistic sequencing might not perfectly reproduce video and audio streams if the video stream were artificially generated from randomly generated data (making, in general, each pixel have a different color from its neighbors), because the entire bandwidth of the media stream could be exhausted or exceeded by the assembled combination of information types. This limitation is theoretical, however, and in handling real-world video chat sessions, it would be rare if the transmitter failed to find room for all types of packets. Although the information can be transmitted uncompressed (and hence, there is no data loss due to compression), the reconstructed streams may not be perfectly true to the original audio and video streams, since the reclockers may perform interpolation of opportunistically-sequenced packets, in order to obtain the correct clock rate and synchronize the audio and video streams. A few packets may be dropped or ignored, but in real-world contexts, these losses are trivial compared to loss introduced by lag in running the video chat software, arising from network latency, slow PC hardware, and marginal PC graphics resolution.

The transceivers may use buffers to hold data being processed. The transceivers may include a protocol channel, whereby one transceiver can signal the other transceiver that a buffer is full or nearly full. A transceiver receiving such a signal may respond by slowing down, or stopping processing; upon receiving an "all clear" signal, normal processing can resume.

BRIEF DESCRIPTION OF THE DRAWINGS

FIG. 2a is a block diagram illustrating components of a PC serving as a local node, and some of the types of devices that might play the role of the PC.

FIG. 2b is a block diagram illustrating components of a group node in a PC-based video conferencing system.

DETAILED DESCRIPTION OF EXEMPLARY EMBODIMENTS

Introduction

This description provides embodiments of the invention intended as exemplary applications. The reader of ordinary skill in the art will realize that the invention has broader scope than the particular examples described in the text and accompanying figures. For example, we will use a conference room in our discussion for illustrative purposes. The system might be used in other contexts, such as a home, or even outdoors.

A few notes are in order about conventions that are followed in the description and claims. The third, or third and fourth, digits from the right of a reference number indicate the first figure, or group of figures (e.g., FIG. 1a-1d), in which the item to which the reference number occurs first appears. A single item may be tagged with more than one reference number to indicate an "is a" relationship. For example, an item may be both a node and a group node. A group node is a node. All nodes, whether individual or group, share some characteristics; group nodes have some specific characteristics not shared by individual nodes, and conversely.

The conjunction "or" is used inclusively (e.g., A or B is true if A is true, if B is true, or if both A and B are true), unless otherwise clear from the context. "Logic" includes logic in hardware; and/or logic in software instructions, accessed from tangible storage and executed by a processor or processing system.

Room Video Chat System

Overview

FIG. 1a-1d illustrate some of the possible video chat configurations involving a group node 110. In each case, the video chat among nodes 100 occurs over some communication system 160. For our purposes, a communication system 160 is any system of hardware and software that facilitates the transmission of audio and visual information in real-time (defined previously), such as the Internet or a local area network. We use the term recursively so any communicatively-coupled combination of communication systems 160 is itself a communication system 160. The communication may be two-way, as indicated by arrows, typified by 161.

Figure 1C:
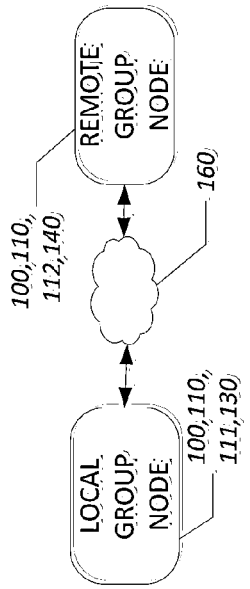
FIG. 1c is a conceptual diagram illustrating a video chat session, or a presentation session, between a local group node and a remote group node.
Figure 1D:
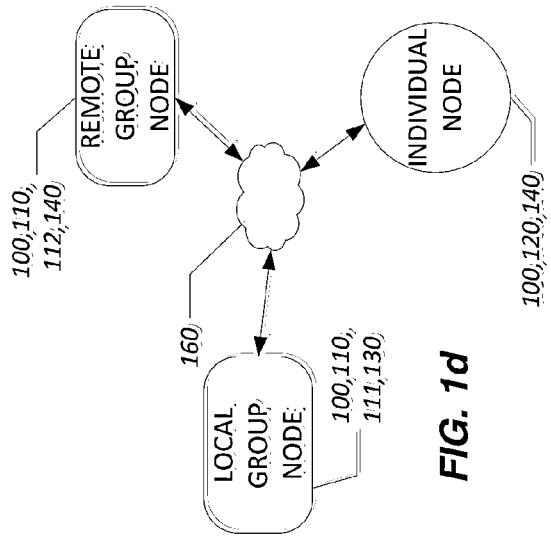
FIG. 1d is a conceptual diagram illustrating a video chat session, or a presentation session, among two group nodes and an individual node.
Figure 1A:
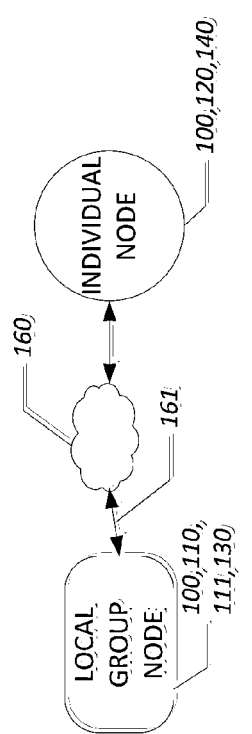
FIG. 1a is a conceptual diagram illustrating a video chat session, or a presentation session, between a local group node and an individual node.
Figure 1B:
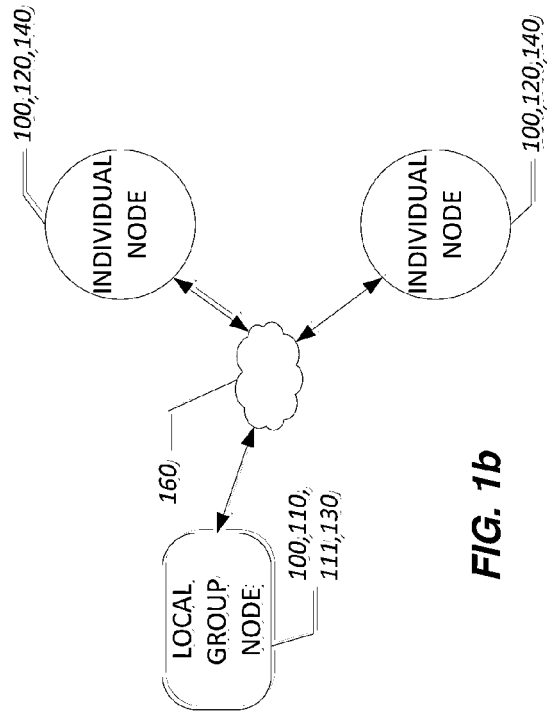
FIG. 1b is a conceptual diagram illustrating a video chat session, or a presentation session, among a local group node and two individual nodes.

The cases shown illustrate a video chat session between or among nodes 100, specifically: a group node 110 and an individual node 120 (FIG. 1a); a group node 110 and two individual nodes 120 (FIG. 1b); a local group node 111 and a remote group node 112 (FIG. 1c); and a local group node 111, a remote group node 112, and an individual node 120 (FIG. 1d). Of course, many other configurations involving a group node 110 and other group nodes 110 or individual nodes 120 are possible. As will be discussed later, any of these configurations (as well as a configuration having a group node 110 only) may be used for a presentation using media presentation software 224 (e.g., a slideshow or a video) from a local PC 201. Note that an individual node 120 is always considered a remote node 140 for our purposes, while a group node 110 may be either an individual node 120 or a remote node 140.

FIGS. 2a and 2b illustrate components of an individual node 120 and a group node 110, respectively. The individual node 120 is a PC 200 that includes video chat software 210 (or video conferencing software), which would be executing during the chat session, and sending and receiving audio and video streams through a connection to communication system 211. A PC user interface 212 is used for configuring, initiating, and terminating execution of the video chat software 210. A PC microphone 223 is used to capture audio by an individual node 120; a PC camera 221 captures a video stream by an individual node 120. A PC monitor 222 displays video received by an individual node 120 from other nodes; a PC speaker 220 (or a headset) outputs sound received by an individual node 120 from other nodes. Some of these components may be internal to the PC 200, and others may be external, coupled wirelessly or by wire. Some PCs 200 may not have all the components, and still be able to participate in a video chat session as an individual node 120. For example, a PC 200 without a PC camera 221 might still participate, but other participants would receive audio but not video from this participant. Some of the types of PCs 200 that might serve as an individual node 120 include a laptop computer 230, a smart phone 231, and a tablet computer 232.

The group node 110 configuration of FIG. 2b includes a PC 200. There need be nothing special about this PC 200, although preferably it will be a desktop or laptop computer. The group node 110 illustrated also includes a speaker 260, a camera 261, a monitor 262, a microphone 263, and a user interface 264, which are elements of a PC-based video conferencing system 250, external to the PC 200. The PC 200 may still have its own speakers, camera, monitor, and/or microphone, but those of the video conferencing system 250 will be better suited for group use in a conference room. The PC 200 of the group node 110 may include (in tangible storage) and execute media presentation software 224 (e.g., slideshow software; movie, TV, or other video software; or software such as a browser that enables the PC to obtain video and audio streams from a network). When the video conferencing system 250 is used in presentation mode, this information may be presented by the conference room equipment of the video conferencing system 250.

Figure 3:
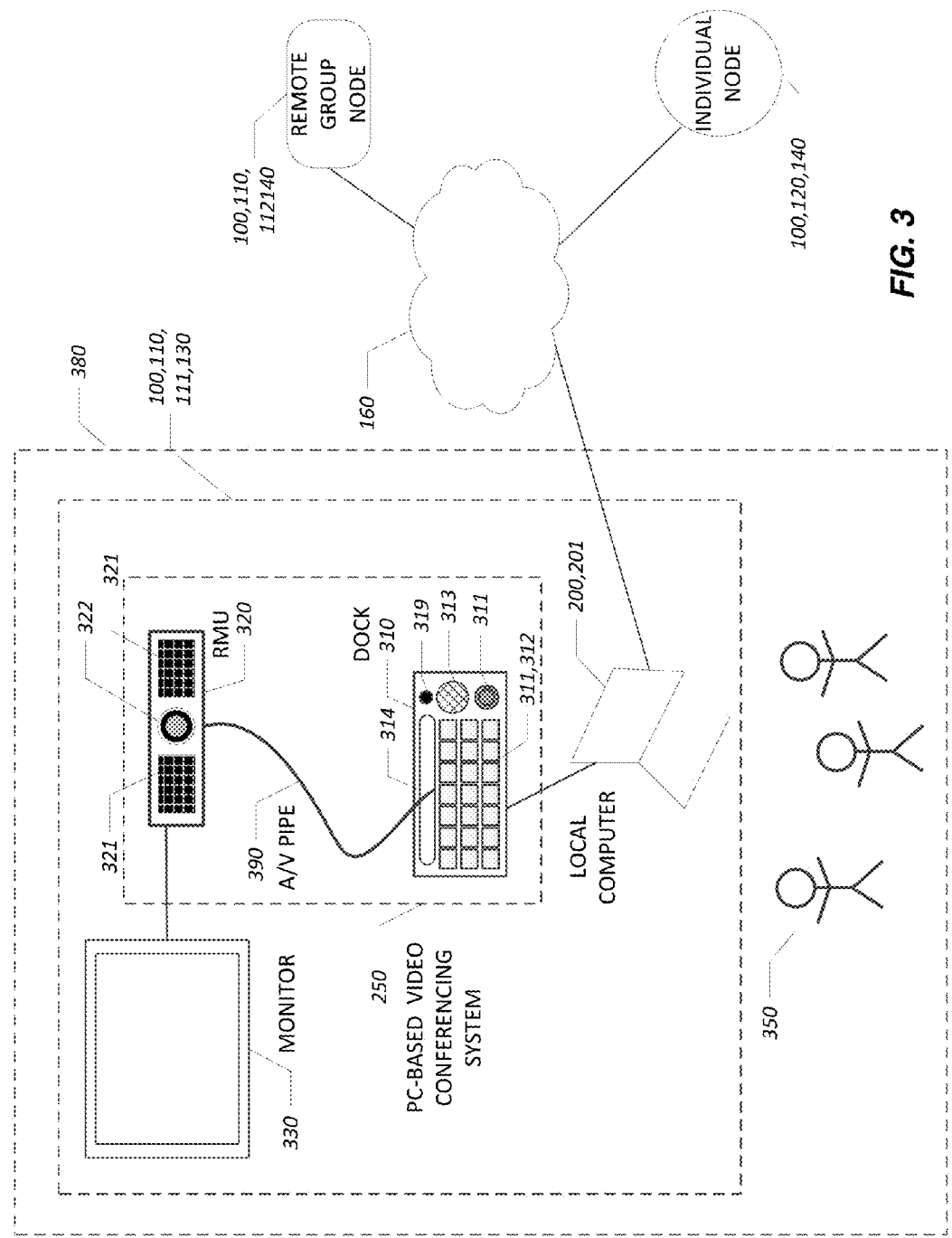
FIG. 3 is a conceptual diagram illustrating components of a PC-based video conferencing system, serving as a local group node in a video chat, or a media presentation, session with two remote nodes.

FIG. 3 is a conceptual diagram illustrating an embodiment of a PC-based video conferencing system 250. A group node 110 that includes a PC-based video conferencing system 250, is engaged in a video chat session with two remote nodes 140; namely, a group node 110 and an individual node 120. The system 250 is located in a room 380, which also contains several participants 350. The participants 350 share a single local PC 201, which they use to run video chat software 210. The video conferencing system 250 of FIG. 3 includes a dock 310, a room media unit (RMU) 320 connected by what we will refer to as a audio-visual (A/V) "pipe" 390, or simply a pipe 390. The pipe 390 may be a cable, or any other type of communication system 160. The dock 310 includes one or more interfaces for connections to the local PC 201 ("local" in the sense that it is in the room 380), whereby audio streams, video streams, and control information can be transferred between the two devices. The dock 310 also a tactile user interface (UI) 311, which may include a keyboard 312 and other controls. These controls may be physical buttons, knobs, and so forth, they may be touch screen controls, or any other UI controls whereby a user can communicate with a smart device. The dock 310 may have a dock display 314 that, for example, displays information entered from the tactile UI 311, information received from the local PC 201, or system status information. The dock 310 will preferably have a room microphone 319, which may be part of a speakerphone 313. The mic 319 will be used to capture audio from the room 380 (e.g., voices of participants when speaking) for transmission to the remote nodes 140. The speakerphone 313 may or may not be configured for telephonic communication, such as through a wired or wireless phone system.

The RMU 320 may contain, or be coupled to, one or more speakers 321 and one or more cameras 322 or camera systems. Audio received by the local PC 201, via its video chat software 210, from the remote nodes 140 is output through the speakers 321. The speakers 321 may also be used, when the system is in presentation mode, to output audio from the room mic 319 or from a mic in a PC 200, either local or remote. In conference mode, video captured by the camera 322 will be transmitted to local PC 201, and then from the local PC 201, again via the video chat software 210, to the remote nodes 140.

The RMU 320 may contain, or be coupled to, one or more monitors 330. In FIG. 3, the monitor 330 is shown as external to the RMU 320, but in some embodiments, the monitor 330 and some or all other RMU 320 components might be integrated into a single housing. In conferencing mode, the monitor 330 may output video from one or more remote nodes 140. In presentation mode, the monitor 330 may output video from a PC 200, either local or remote.

Preferably, the pipe 390 will be an inexpensive, standard off-the-shelf, component, such as a single CAT 5, CAT 6, or CAT 7 cable. In other embodiments, other forms of wired or wireless transmission systems may be used, alone or in combination.

Docking Station

Figure 4:
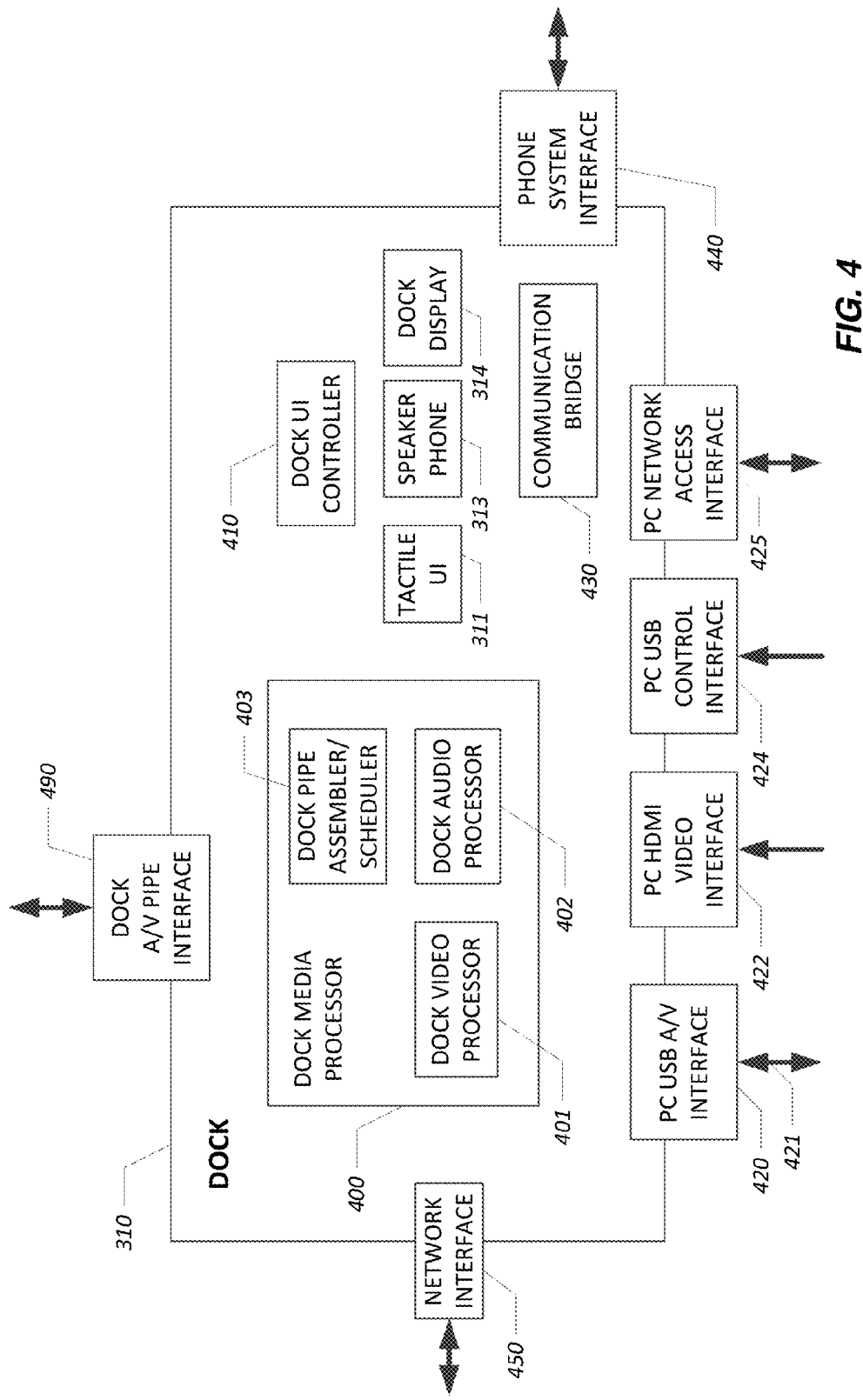
FIG. 4 is a schematic diagram illustrating a dock, including logic components and interfaces, of a PC-based video conferencing system.

FIG. 4 illustrates components of a docking station 310 of a PC-based video conferencing system 250 in more detail. The dock 310 may include a tactile UI 311. The tactile UI 311 might be used, for example, for coordination with the local PC 201 in setting up and administering execution of the video conferencing system 250; entering telephone numbers for communicating by phone with, or connecting with remote nodes 140; setting up or manipulating the speaker 321, camera 322, monitor 330, mic 319, or the speakerphone 313. In addition to possibly providing access to a telephone system, a microphone 319, possibly included in the speakerphone 313, may be used to capture audio information from the room, for transmission through the local PC 201 to the remote nodes 140. Preferably, the speakerphone 313 will produce HD audio, possibly by using echo cancellation technology. The dock display 314 has already been described. The elements of the dock user interface (e.g., tactile UI 311, mic 319, dock display 314, speakerphone 313) are controlled and managed by a dock UI controller 410. The dock 310 has interfaces for exchanging information with the local PC 201. Arrows, typified by arrow 421 show exemplary directionality of transmissions through the interface.

During video conferencing/chat, the dock 310 receives remote audio and video streams from the remote nodes 140 through the local PC 201, and sends local audio and video streams to the remote nodes 140 through the local PC 201. Note that a television monitor can display video in HDMI format, but not video in USB format. Consequently, it is preferable that the dock 310 receive remote node 140 video from the local PC 201 through a PC HDMI interface 422. Alternatively, the video input may be YCbCr, RGVHV, or any other format. The dock 310 may have multiple video (and/or audio) ports, and the logic to automatically switch between them, depending on what is discovered to be connected. Audio from the local PC 201 can be received through a PC USB A/V interface 420, and both audio and video from the dock 310 to the local PC 201, intended for the remote individual nodes 120, can also be transmitted through the PC USB A/V interface 420. The dock 310 may also include a PC USB control interface 424, through which control commands from the local PC 201 to configure the video conferencing system 250 can be received, and conversely.

The dock 310 communicates audio, video, and control information with the RMU 320. In principle, any communication system that can achieve that will do. Preferably, however, communication with the RMU 320 will be through a single cable, which we refer to as an A/V pipe 390, coupled to the dock 310 through a dock A/V pipe interface 490. Preferably, the cable will be an inexpensive, off-the-shelf product, such as CAT 6 cable.

A variety of information must pass from the dock 310 through the A/V pipe 390 to the RMU 320, including, for example: video information in HDMI format from the remote nodes 140, via the local PC 201; audio information in USB format from the remote nodes 140, via the local PC 201; control information from the local PC 201; and control information from the tactile UI 311. In some embodiments, some or all of the control information may be converted into a video representation, and configured to overlay video output on the monitor 330. Additionally, video information in USB format from the RMU camera 322 passes from the RMU 320 through the A/V pipe 390 to the dock 310.

A dock media processor 400 is responsible for channeling and managing the information flows through the various interfaces. This includes handling data format, timing, and synchronization. The dock media processor 400 includes a dock video processor 401 for managing the video information in both directions; a dock audio processor 402 for managing the audio information in both directions; and a dock pipe assembler/scheduler 403 for handling the timing and synchronization required to integrate all the information being passed through the A/V pipe 390.

Some dock 310 embodiments may also include a communication bridge 430 to the phone system interface 440. This arrangement may allow video chat software 210 running on the local PC 201 to communicate with a telephone communication system, with the dock 310 serving as intermediary between the local PC 201 and the telephone system.

Some dock 310 embodiments may also include a network interface 450 to provide access to a communication system 160, such as the Internet or a local area network. That access may be passed through to the local PC 201 through a PC network access interface 425.

Room Media Unit

Figure 5:
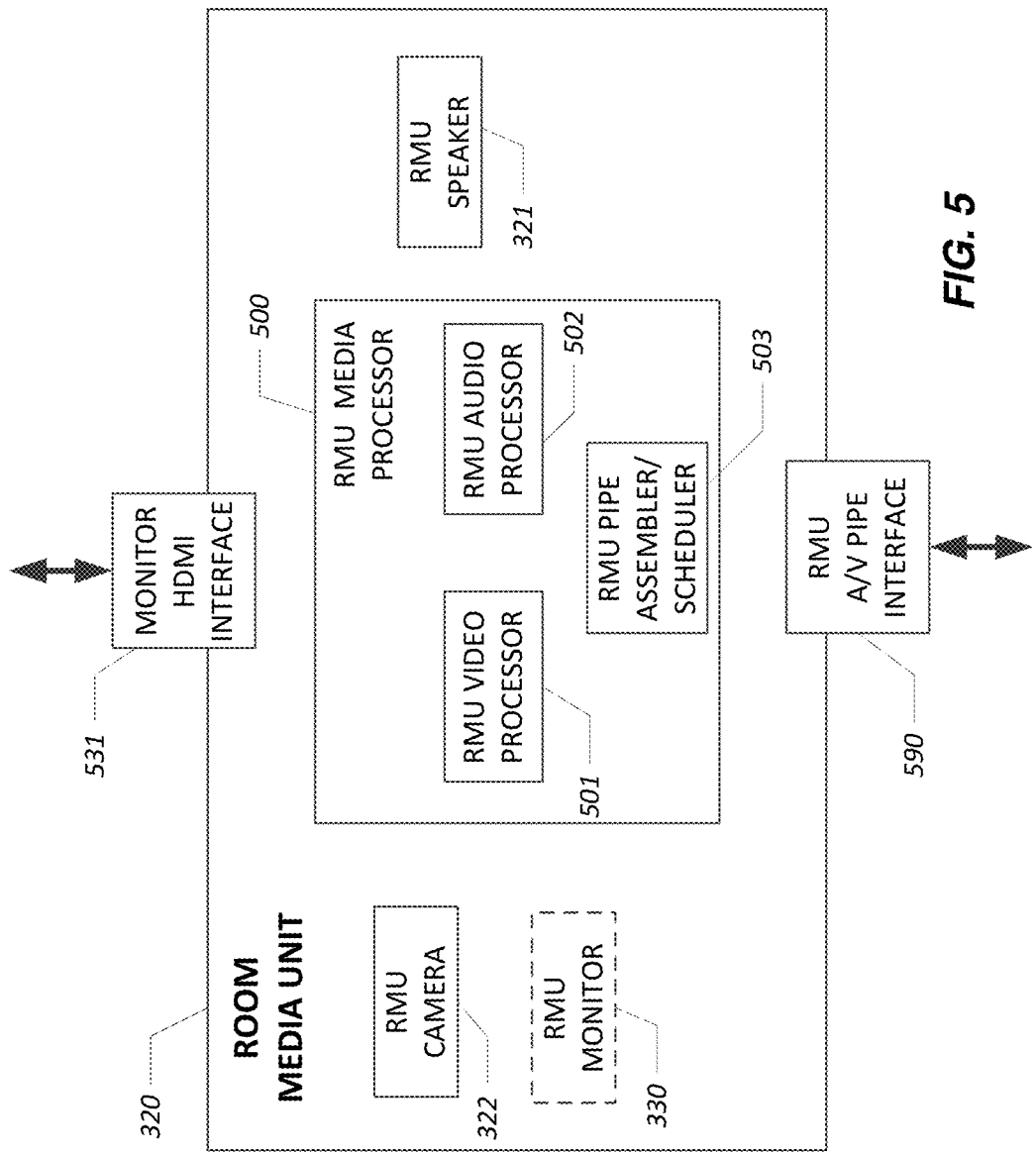
FIG. 5 is a schematic diagram illustrating a room media unit (RMU), including logic components and interfaces, of a PC-based video conferencing system.

FIG. 5 is a schematic diagram illustrating a RMU 320, including exemplary components and interfaces, of a PC-based video conferencing system 250. The RMU 320 may include, in a housing, one or more speakers 321 that output sound received from the remote nodes 140 via the local PC 201 and dock 310. The RMU 320 may include one or more cameras 322, that capture video information from the conference room 380 or other area where the participants 350 in the group node 110 is gathered. A camera 322 may be of any type, and have functionality that ranges from static to highly complex. Preferably, if the camera 322 is static, then it will have a field of view that is at least 70, or at least 80 degrees. The camera 322 might have a variable field of view, such as approximately 3 degrees to 80 degrees; in this case, the maximum field of view should be at least 70, or at least 80 degrees. A camera 322 may implement automatic tracking of speakers; it may have the capability to focus on individual speakers, or the room 380 as a whole. The RMU 320 may communicate through an interface, such as a monitor HDMI interface 531 to one or more monitors 330 external to the RMU 320; in other embodiments, a monitor 330 (shown dashed in the figure) may be configured as with a housing of the RMU 320 itself.

The RMU 320 may communicate a variety of information with the dock 310 through the A/V pipe 390. Consequently, the RMU 320 may include a RMU media processor 500. Like the dock media processor 400, the RMU media processor 500 is responsible for receiving, scheduling and formatting information being communicated through a RMU A/V pipe interface 590 with the dock 310, in both directions. As such, it may include a RMU video processor 501, a RMU audio processor 502, and a RMU pipe assembler/scheduler 503.

Room Presentation of Audio/Video from Remote Node

Figure 6:
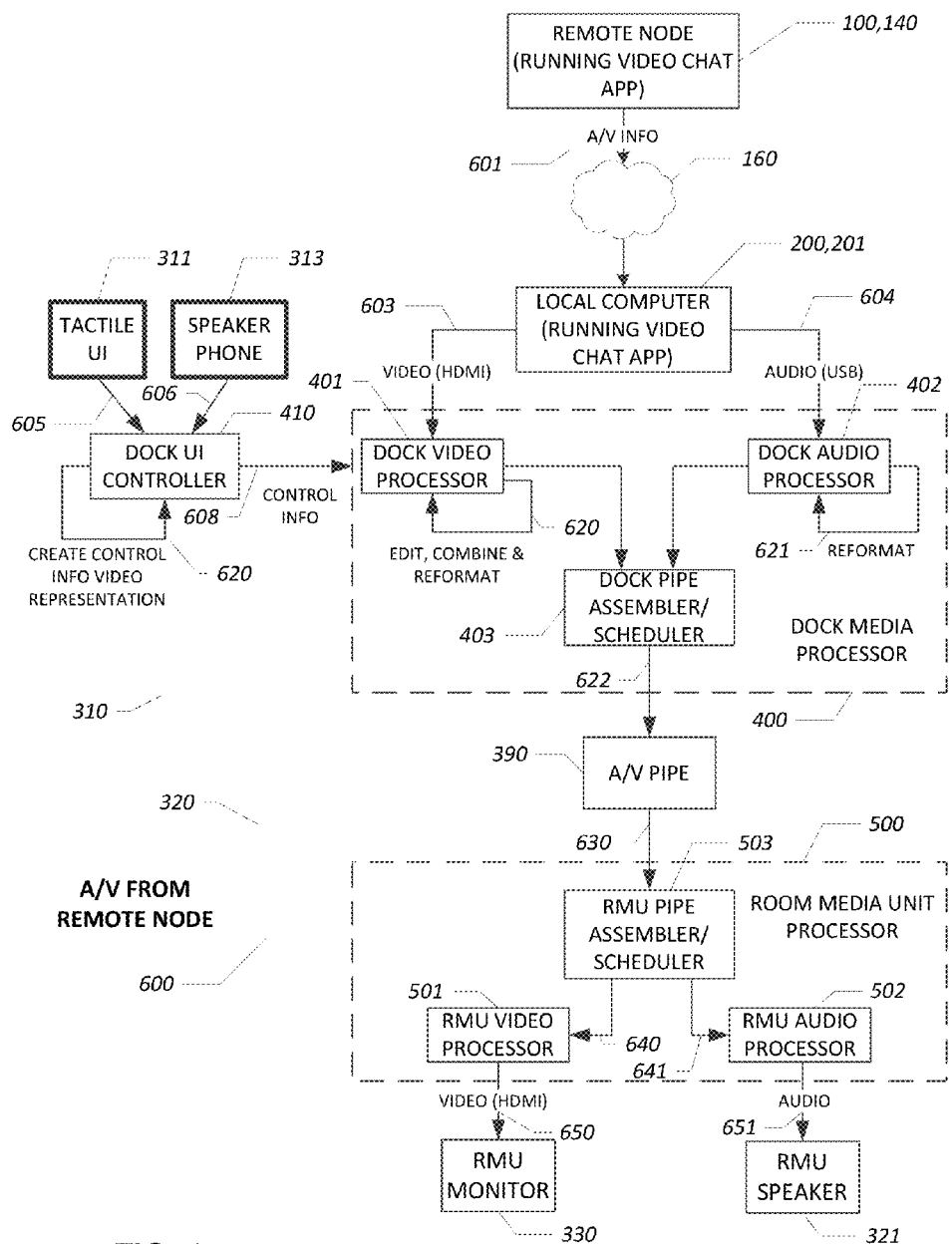
FIG. 6 is an information flow diagram illustrating the flow of real-time audio and video streams from a remote node to a PC-based video conferencing system.

FIG. 6 is an information flow diagram 600 illustrating the flow of real-time audio and video streams from a remote node 140 to a PC-based video conferencing system 250. This diagram illustrates both a system embodiment and a process embodiment of some of the concepts of the invention. In the diagram, heavily-outlined boxes indicate sources of information from within the video conferencing system 250 itself. Audio/visual information 601 is transmitted from the remote node 140, which is running video chat software 210 (or video conferencing software), through communication system 160 to local PC 200. Settings in the PC 200 allow it to specify that the its video will be output (in this embodiment) via HDMI connection; and that audio will transmitted (in this embodiment) via USB connection. The dock media processor 400 receives this information as 603 and 604, respectively.

Control information 605 from the tactile UI 311, and status information 606 from the speakerphone 313 may be transmitted to the dock UI controller 410, which will in turn transmit control information control information 608 to the dock media processor 400. Some control information may be used to control the system; some control information may be converted by the dock video processor 401 into a video format, e.g., for overlay on the monitor 330 over the video stream originating from the remote node 140.

Video 603 received from the local PC 201 is reformatted by the dock video processor 401 into a form suitable for transmission through the A/V pipe 390 to the RMU 320. As already mentioned, when control information 608 is received from the dock UI controller 410, the dock video processor 401 may select some or all of that information to overlay the local PC 201 video on the monitor 330; that data will be reformatted by the dock video processor 401 for A/V pipe 390 transmission. Audio 604 received from the local PC 201 is reformatted by the dock audio processor 402 into a form suitable for transmission through the A/V pipe 390 to the RMU 320. The dock pipe assembler/scheduler 403 schedules and assembles video from the dock video processor 401 and audio from the dock audio processor 402 into an integrated stream of packets, which contain information about timing, so that the RMU media processor 500 is able to preserve synchronization of the audio and video output from the system.

The A/V pipe 390 carries media stream 622 from the dock media processor 400 to the RMU media processor 500. Preferably, the A/V pipe 390 will be a CAT 5, CAT 6, or CAT 7 cable, but any other form of wired or wireless communication system might be used instead.

Information received 630 from the A/V pipe 390 is disassembled by the RMU pipe assembler/scheduler 503 into its video component 640, which it sends to the RMU video processor 501, and its audio component 641, which it sends to the RMU audio processor 502. The RMU video processor 501 formats and sends video 650 to the monitor 330. This is preferably in HDMI form, but it could be RGB, NTSA, or VGA, or any other format capable of being displayed on a monitor. The RMU audio processor 502 formats and sends audio 651 to the RMU speakers 321.

Room Audio/Video Capture and Transmission to Remote Node

Figure 7:
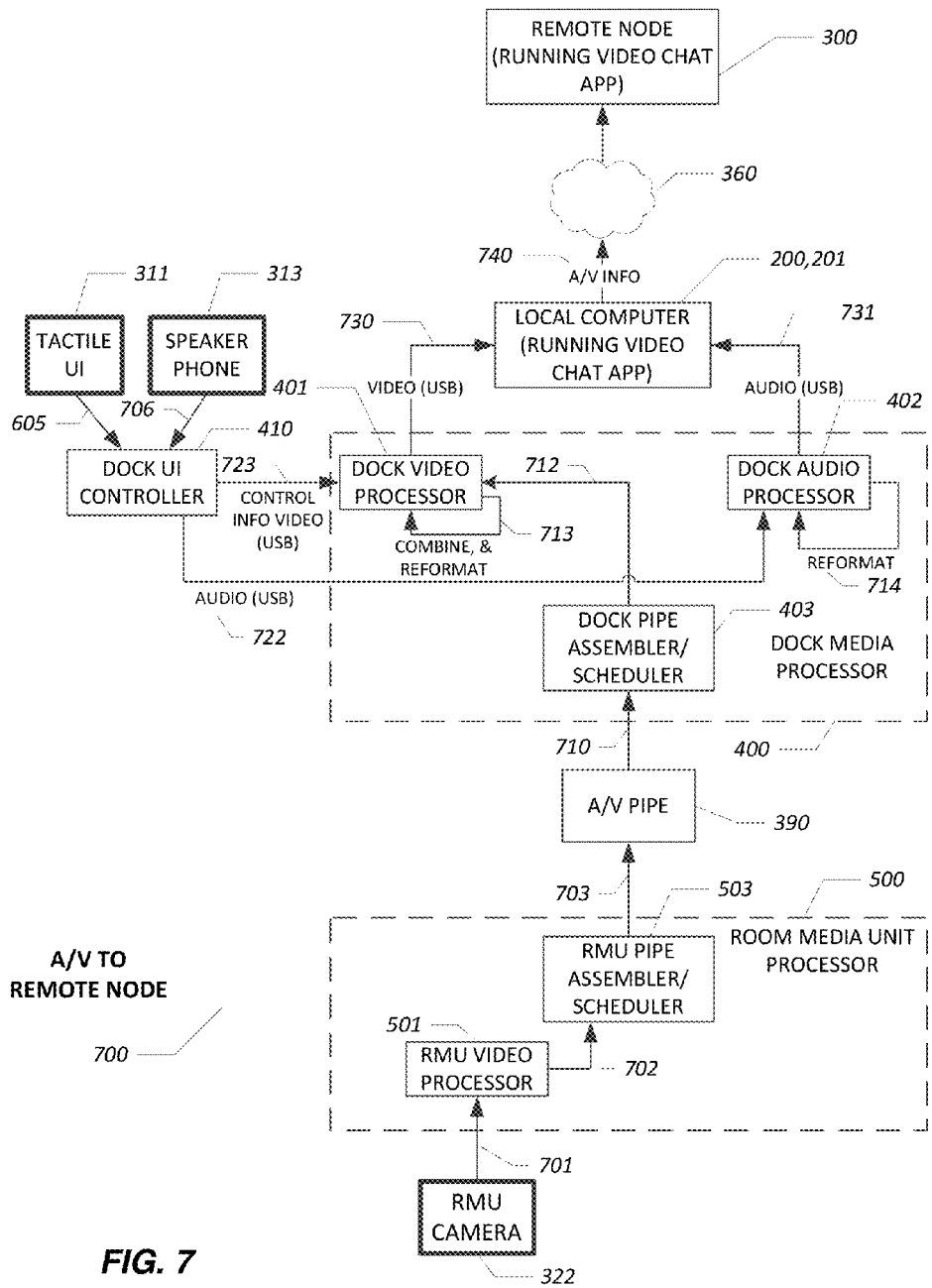
FIG. 7 is an information flow diagram illustrating the flow of real-time audio and video streams to a remote node from a PC-based video conferencing system.

FIG. 7 is an information flow diagram 700 illustrating the flow of real-time audio and video information to a remote node 140 from a PC-based video conferencing system 250. This diagram illustrates both a system embodiment and a process embodiment of the invention. In the diagram, heavily-outlined boxes indicate sources of information from within the video conferencing system 250 itself.

Video is captured from the conference room 380, or other group setting, by the camera 322 of the video conferencing system 250 and transmitted 701 to the video processor 501 of the RMU media processor 500. The RMU video processor 501 converts the video into a format suitable for transmission over the A/V pipe 390. The RMU pipe assembler/scheduler 503 receives 702 the video from the RMU video processor 501, and forms data packets having timing/synchronization information sufficient for disassembly by the dock pipe assembler/scheduler 403 that preserves the real-time nature of the audio and video streams. Packetized information sent 703 by the RMU pipe assembler/scheduler 503 passes through the A/V pipe 390, and is received 710 by the dock pipe assembler/scheduler 403. The dock pipe assembler/scheduler 403 disassembles information from the A/V pipe 390 and sends it 712 to the dock video processor 401. The dock video processor 401 reformats 713 the video into USB, and sends 730 it to the local PC 201.

Audio is captured 706 from the conference room 380, or other group setting, by the room microphone 319. This audio is received 722 by the dock audio processor 402, which reformats the audio and sends 731 it to the local PC 201 in USB format. Some status or control data entered through the tactile UI 311 of the dock 310 that is transmitted 605 by the dock UI controller 410 to the dock video processor 401 may be reformatted and sent 730 as USB video to the local PC 201. Ultimately, A/V information 740 is transmitted to the remote nodes 140.

Media Presentation System

The same components and methods already described can also be applied to a local room 380 presentation. In other words, the system has applicability for both video conferencing/chat, and for local presentation. In the local presentation mode, audio, video, and control information from the local PC 201 is presented on the monitor 330 and the speakers 321. The local PC 201 might be executing, media presentation software 224, such as slideshow or movie/TV software. Audio and video may be received by the dock 310 from the local PC 201 through the same interfaces shown in FIG. 4. Audio might, alternatively or in addition, be captured from the room mic 319, and presented on the speakers 321. Note that the monitor 330 might be replaced with a projector/screen combination, for use in a larger room.

A presentation conducted on the local PC 201 can also be transmitted to remote nodes 140, using the same video chat software 210 already discussed. We will refer to this as presentation-over-chat mode. For example, a speaker might run slideshow software on the local PC 201, making a local room presentation. The voice of the speaker is captured by microphone of the speakerphone 313. The slide presentation is transmitted to the dock 310, to which the local PC 201 is connected. The dock 310 may route the video to the monitor 330, the audio to the speakers 321, and both the audio and video to the local PC 201 for transmission via video chat software 210 to remote nodes 140. Questions of the speaker may also be received from the remote nodes 140. This might be facilitated by the bidirectional transceiver system of FIG. 8-11.

In summary, the system 250 may be used in at least three modes: video chat mode (which might also be used to present a lecture or other presentation, originating from a remote node 140, in the conference room); local presentation mode; and presentation-over-chat mode.

Bidirectional A/V: Opportunistic Sequencing and Transmission

Many types of systems might be used for communication between the dock 310 and the RMU 320 of a PC-based video conferencing system 250, as shown in FIG. 3-7. We now describe a particular configuration of A/V pipe 390 that has much more general applicability. Note that the A/V pipe 390 described below has specific implementation details, but the practitioner in the art will realize that many of these details can be modified within the inventive concepts illustrated thereby.

This A/V pipe 390 facilitates bidirectional transmission of uncompressed video, audio, control, network, and power over a CAT 5, CAT 6, or CAT 7 cable, or other cable having similar architecture and transmission rate at least equal to a minimum adequate transmission rate. The minimum adequate transmission rate can be estimated as the sum of the target video rate, the audio rate (e.g., 2 Mbit/s), and the control/header rate (e.g., 1 Mbit/s). CAT 6 cable, which we will take as exemplary, can handle 60 frames per second. Cables having slower transmission rates can be accommodated by reducing resolution of the video, or by having lower video frame rate.

Figure 8:
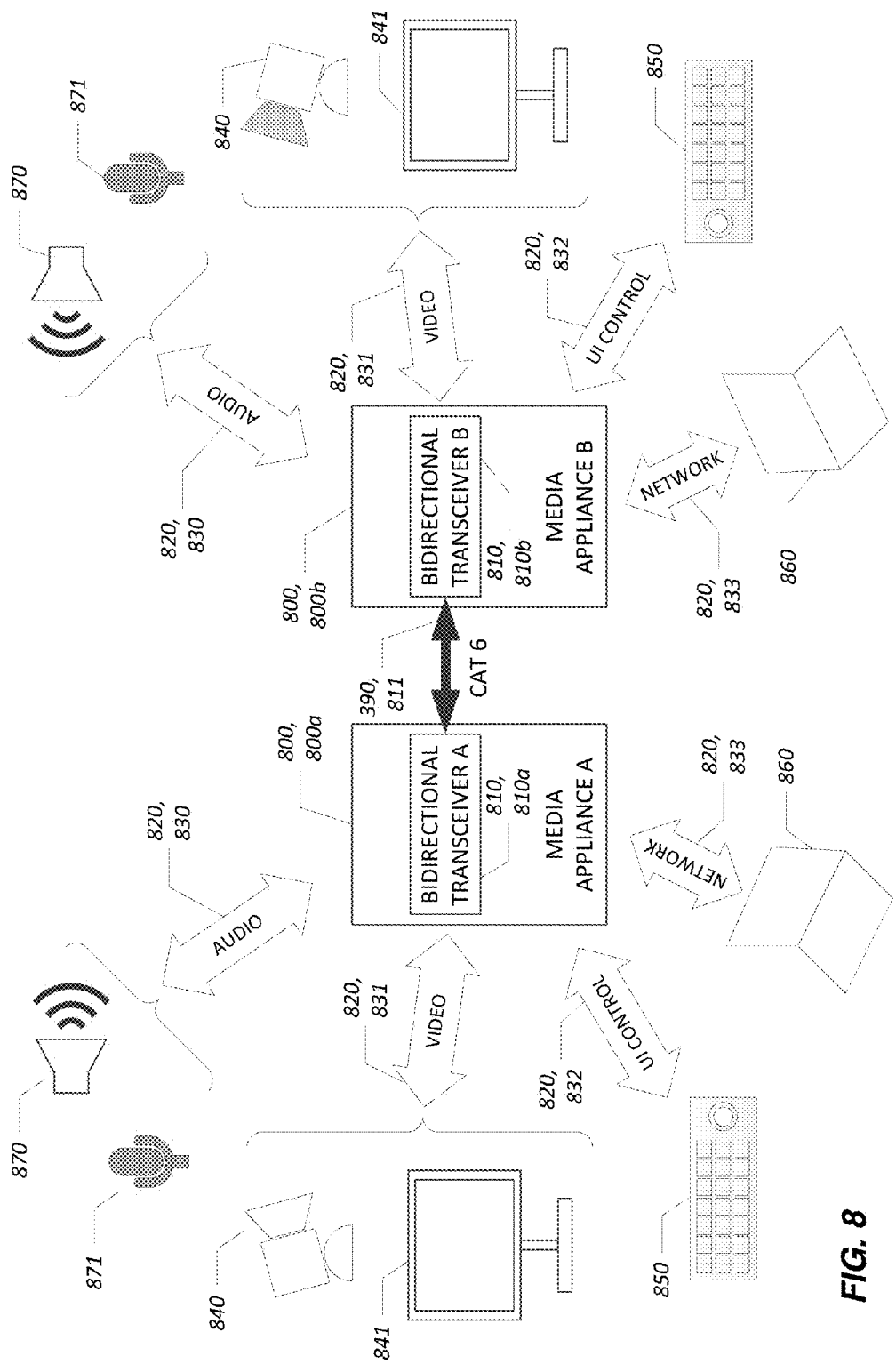
FIG. 8 is a conceptual diagram showing bidirectional transfers of various types of information (e.g., audio, video, network, and control) between a pair of transceivers.

FIG. 8 is a conceptual diagram showing four types of bidirectional transmissions between a pair of media appliances 800, namely media appliance A 800a and media appliance B 800b. Each media appliance 800 includes a bidirectional transceiver 810, namely bidirectional transceiver A 810a and bidirectional transceiver B 810b, respectively. The bidirectional transceivers 810 can simultaneously handle four media types 820, in both directions; namely, an audio stream 830; a video stream 831; a UI control channel 832; and network connectivity 833. The audio and/or video can be transferred uncompressed. The audio stream 830 might transfer audio from a microphone 871, or to a speaker 870. The video stream 831 might transfer video from a camera 840, or to a monitor 841. The UI control channel 832 might transfer control information to or from a tactile UI 850. A computer 860 may receive network connectivity 833, e.g., Ethernet at 10/100/1000, and also exchange audio, video, and control with the remote media appliance 800 in both directions. The A/V pipe 390 may also transfer power from one of the media appliances 800 to the other.

Figure 9:
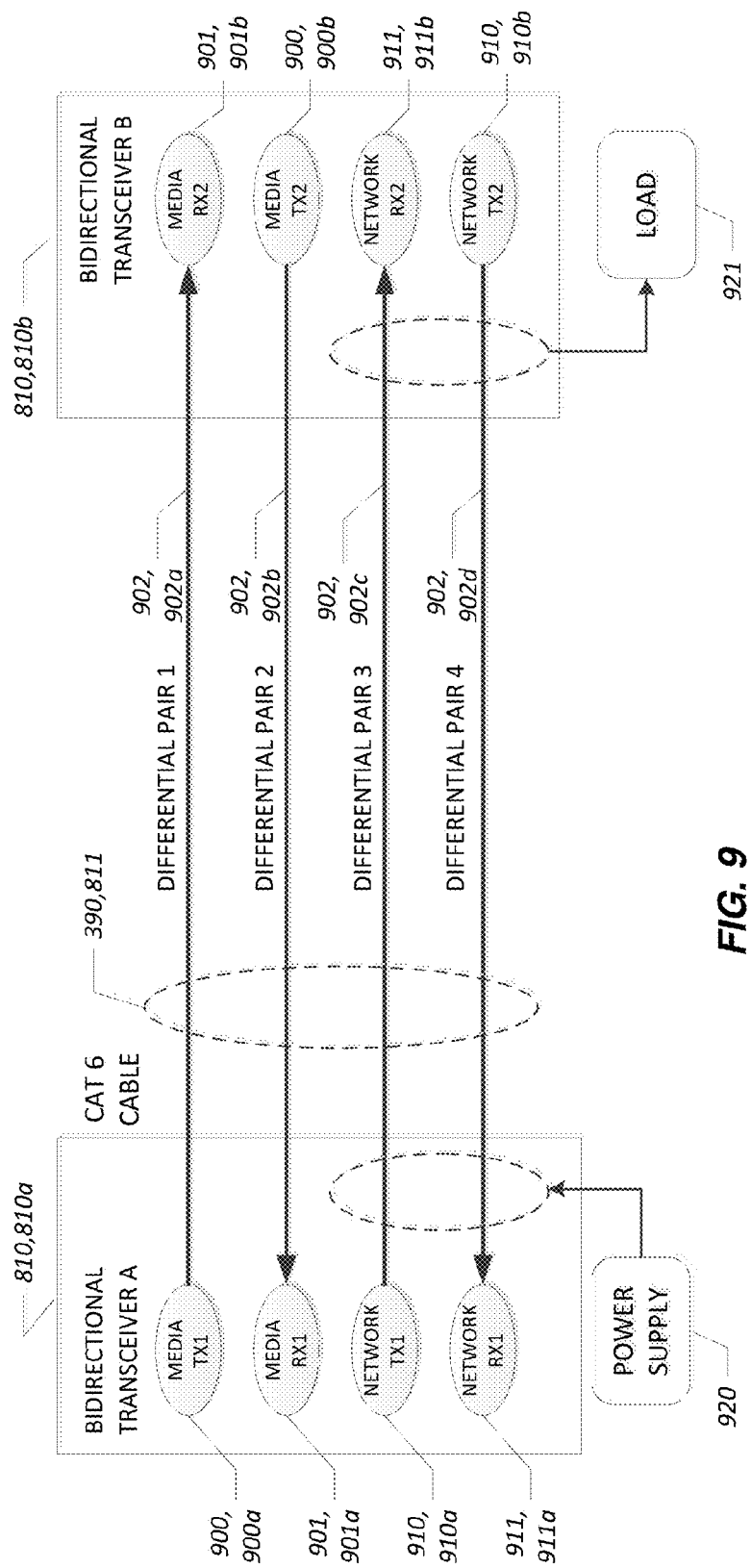
FIG. 9 is a block diagram that illustrates the transport layer of a pair of bidirectional transceivers.

FIG. 9 depicts a pair of bidirectional transceivers 810 connected by an A/V pipe 390, which in this embodiment is a CAT 6 cable 811. (Note that CAT 5 and CAT 7 cables have essentially the same structure as CAT 6 cable 811.) Each bidirectional transceiver 810 includes a media transmitter 900, a media receiver 901, a network transmitter 910, and a network receiver 911. (We adopt the convention that extensions 'a' or 'b' may designate a particular transceiver as in 900*a*, or a particular differential wire pair, as in 902*a*.) Each transmitter in one bidirectional transceiver 810 is connected to a counterpart receiver in the other bidirectional transceiver 810 by a respective differential wire pair 902 (i.e., 902*a*-902*d*) on the CAT 6 cable 811. The result is connectivity to send and receive both media and network in both directions. The network transmitter 910 and network receiver 911 pairs also carry 24 Vdc power on differential pair 3 902*c* and differential pair 4 902*d*, allowing either enclosing media appliance 800 to be powered by the other; in FIG. 9, a load 921 on media appliance B 800*b* is powered by a power supply 920 on media appliance A 800*a*.

The media transmitter 900 and media receiver 901 pairs utilize a unique approach to communicate multiple media types 820, such as those shown in FIG. 8, in either direction within the CAT 6 cable 811. The pair implement a transport layer, a protocol layer, and data layers. The transport layer has been illustrated, e.g., by FIG. 9. The protocol and data layers are illustrated, e.g., by FIG. 10.

Media Transmitter

Figure 10:
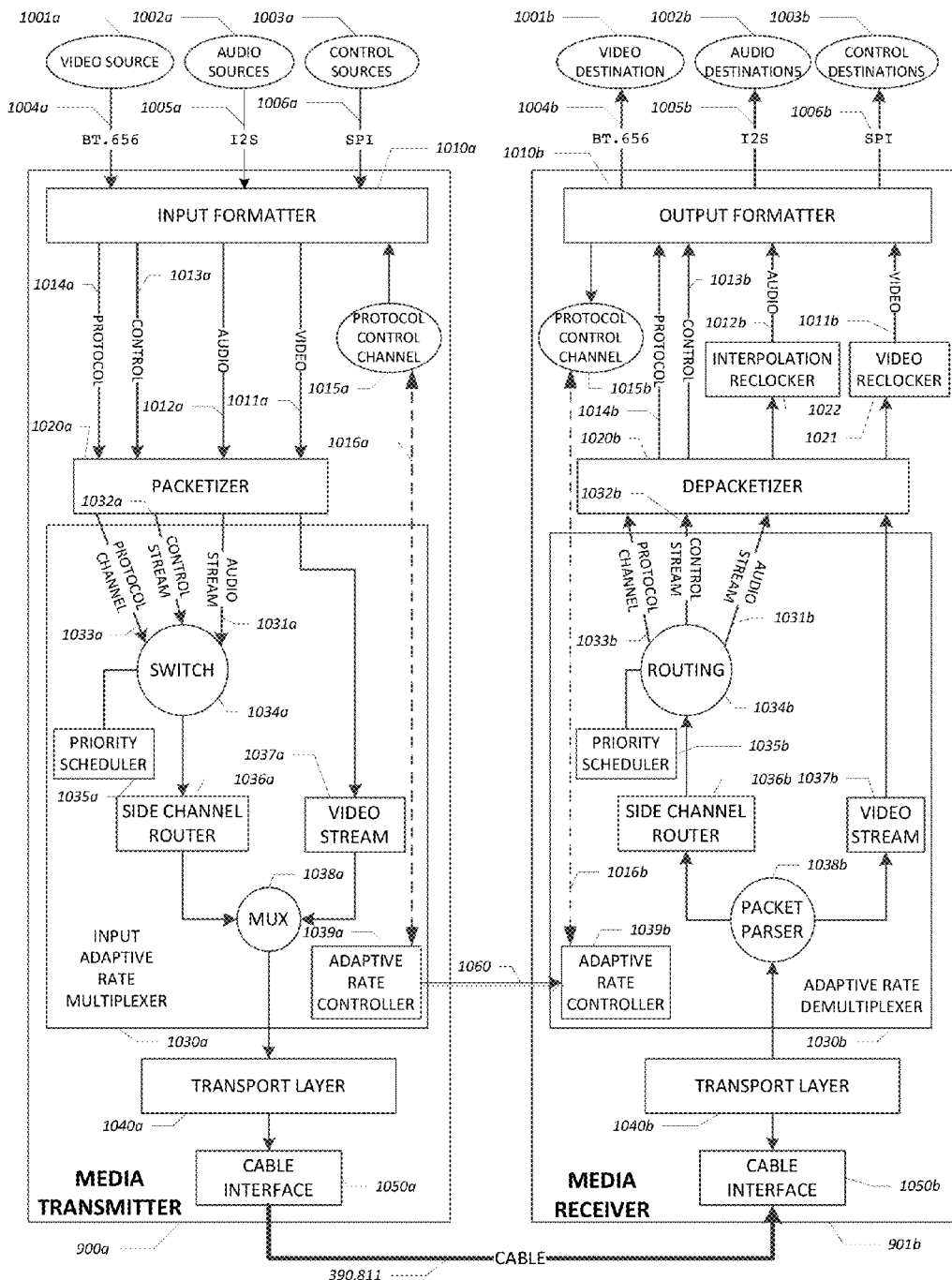
FIG. 10 is a block diagram that illustrates the data and protocol layers of a media transmitter-receiver pair.

As shown in FIG. 10, the media transmitter 900 (e.g., 900*a*) accepts a video source 1001*a*, audio sources 1002*a*, and control sources 1003*a* from the associated media appliance 800. The media transmitter 900 accepts video-in 1004*a* with resolutions up to 1080p and 60 frames/second. Multiple standards-based digital video streams can be accepted to include BT.656 and BT_A120. The media transmitter 900 accepts one or more channels of digital synchronous audio stream 1005*a*. The audio sources 1002*a* can be Pulse Code Modulated (PCM) formats. The media transmitter 900 accepts input 1006*a* from one or more control sources 1003*a* and supports multiple standards based inter-device communications protocols to include UART, SPI, Parallel, I2C. Input streams to the media transmitter 900 are labeled with exemplary protocols.

Media Transmitter: Input Formatter

The input reformatter 1010*a* includes logic, possibly including a video formatter module, an audio formatter module, and a control reformatter module. These logic modules are not shown explicitly in FIG. 10 to avoid too much congestion in an already crowded figure; but their functionality will be described here, and individual output arrows are shown in the figure.

The input video formatter converts the format of the video-in 1004*a* to output, for example, 8 bit YCbCr video 1011*a* at, for example, 720p resolution and 60 frames per second. The video formatter may apply video scalar, color space conversion as appropriate to maintain the 8 bit YCbCr video 1011*a* at 720p resolution.

The input audio formatter accepts 1005*a* N audio channels via I2S format, multiplexes the N audio channels, and aggregates them into a single time division multiplexed audio stream 1012*a*. The input audio formatter also applies decimation or interpolation to audio samples to comply with the 16 bit sample resolution used in transport. Sample rate conversion may also be applied (as needed) to convert an input audio source 1005*a* to a 48 KHZ sample rate.

The input control formatter accepts 1006*a* N control channels of standards based inter-bus communication protocols. This includes The N control channels are aggregated into a single control stream 1013*a*.

Media Transmitter: Packetizer

The packetizer 1020*a* prepares the data payloads (video, audio, control) for transmission to the media receiver 901. A respective module of the packetizer 1020*a* for each of the video, audio, and control streams applies a digital header word to the digital data of the media stream. The header includes metadata, such as the origin of the stream source and the destination for the stream at the far-end media appliance 800. The header may also include other metadata, such as a description of media type (video, audio, control), format, and size. The header may also include handshaking and data validity information used by the media receiver 901 of the far-end media appliance 800 for reconstruction and error correction of payload packets.

Media Transmitter: Input Adaptive Rate Multiplexer

The input adaptive rate multiplexer 1030*a* prioritizes the input streams, with (preferably, but not necessarily) the packetized audio stream 1031*a* having the highest priority in communication between media appliance A 800*a* and media appliance B 800*b*. Video payload bandwidth varies (increases or decreases) based upon the image content being sent over the communications link. The logic determines/detects periods of lower audio bandwidth and injects a lower priority packet, e.g., a control or a video packet into the assembled media stream. We call this "opportunistic sequencing". The non-video packets are called side-band channels.

The audio side-band channel contains audio data packets to be sent to the media RX2 901*b*. The control side-band channel contains control data packets, also to be sent to media RX2 901*b*. The protocol control channel 1015*a* consists of communications used by the protocol logic to regulate bit rate transmit speeds based upon available receiver buffer memory in bidirectional transceiver B 810*b*. The side-band channel provides a method to prevent overflow or error conditions between the media transmitter 900 and media receiver 901 pair.

The input adaptive rate multiplexer 1030*a* also includes priority scheduler 1035*a*. This component uses software and switch 1034*a* for opportunistic sequencing, prioritizing which packet types are sent within the media stream during low bandwidth conditions; for example, the priority might be (1) audio; (2) control; (3) protocol; and (4) video. Based upon the priority level of a side-band channel packet type, side channel router 1036*a* may inject the packet payload into the side-channel stream, which is then combined with the video stream 1037*a* by MUX 1038*a* to form the media stream to be sent to the media receiver 901 (e.g., media RX2 901*b*).

The adaptive rate controller 1039*a* and adaptive rate controller 1039*b* may regulate the transmission speed of the video stream (and embedded side-channels) to prevent overflow conditions; monitor or correct error conditions; or trigger retries of transmissions. Information is shared between adaptive rate controller 1039*a* of media TX1 900*a* and the adaptive rate controller 1039b of media RX2 901b using protocol side-band channel 1060. The adaptive rate controller 1039a may control and communicate with protocol control channel 1015a, as indicated by arrow 1016a. The adaptive rate controller 1039b may control and communicate with protocol control channel 1015b, as indicated by arrow 1016b.

Media Transmitter: Transport Layer

The transport layer 1040a refers to the electrical and physical cable interface 1050a between media TX1 900a and media RX2 901b. The transport layer may use a SerDes 10b/8b encoding scheme (http://en.wikipedia.org/wiki/SerDes) over a differential cable pair (e.g., differential pair 1 902a) on the CAT 6 cable 811 for transmission of media stream packets. The maximum data rate may be 1.562 Gbit/s. However, the system might use a higher or a lower maximum data rate, depending upon capabilities of the specific hardware components used, or upon needs.

Media Receiver

As shown in FIG. 10, the media receiver 901 (e.g., media RX2 901b) receives the media stream from the corresponding media transmitter 900 (e.g., media TX1 900a) and converts it back into separate streams: video stream video-out 1004b to video destination 1001b; audio streams audio-out 1005b to audio destinations 1002b; and control streams control-out 1006b to control destinations 1003b. Many of the components and streams of the media receiver 901 have clear counterparts in media transmitter 900; for the sake of brevity, such components of media receiver 901 are labeled with reference numbers, but will not necessarily be described explicitly again in the text.

Media Receiver: Transport Layer

The transport layer 1040b decodes the SerDes 10b/8b media stream from the physical layer (i.e., CAT 6 cable 811 and cable interface 1050b) and sends the decoded stream to output adaptive rate demultiplexer 1030b.

Media Receiver: Adaptive Rate Demultiplexer

The packet parser 1038b detects side-band channel headers within the video stream. When one is detected, packet parser 1038b extracts the packet from the video stream and sends it to side channel router 1036b for delivery. The side channel router 1036b determines a destination address for the data and routes 1034b the data to the depacketizer 1020b. The depacketizer 1020b strips sideband headers from audio stream 1031b, control stream 1032a, and protocol channel 1033b to prepare for native media formats.

Digital video is a synchronous data source requiring precision clocking between source and destination transducers. The video reclocker 1021 establishes synchronous video clocks to be used with the video data. Video is regenerated by the receiving transceiver, which is the source of the video clock.

The audio interpolation reclocker 1022 establishes a synchronous audio clock by recreating a given (e.g., 48 KHZ) frame clock from the audio data samples. Receiver media RX2 901b is provided the audio frame rate from protocol control channel 1015a of media TX1 900a via protocol control channel 1015b. Receiver media RX2 901b creates the sequence of audio frames based upon this rate. Audio sample data is clocked into this recreated audio frame. The reclocker automatically realigns sample data by shifting bits right or left until the frame, sync, and audio data are in alignment, interpolating frames as necessary.

Figure 11:
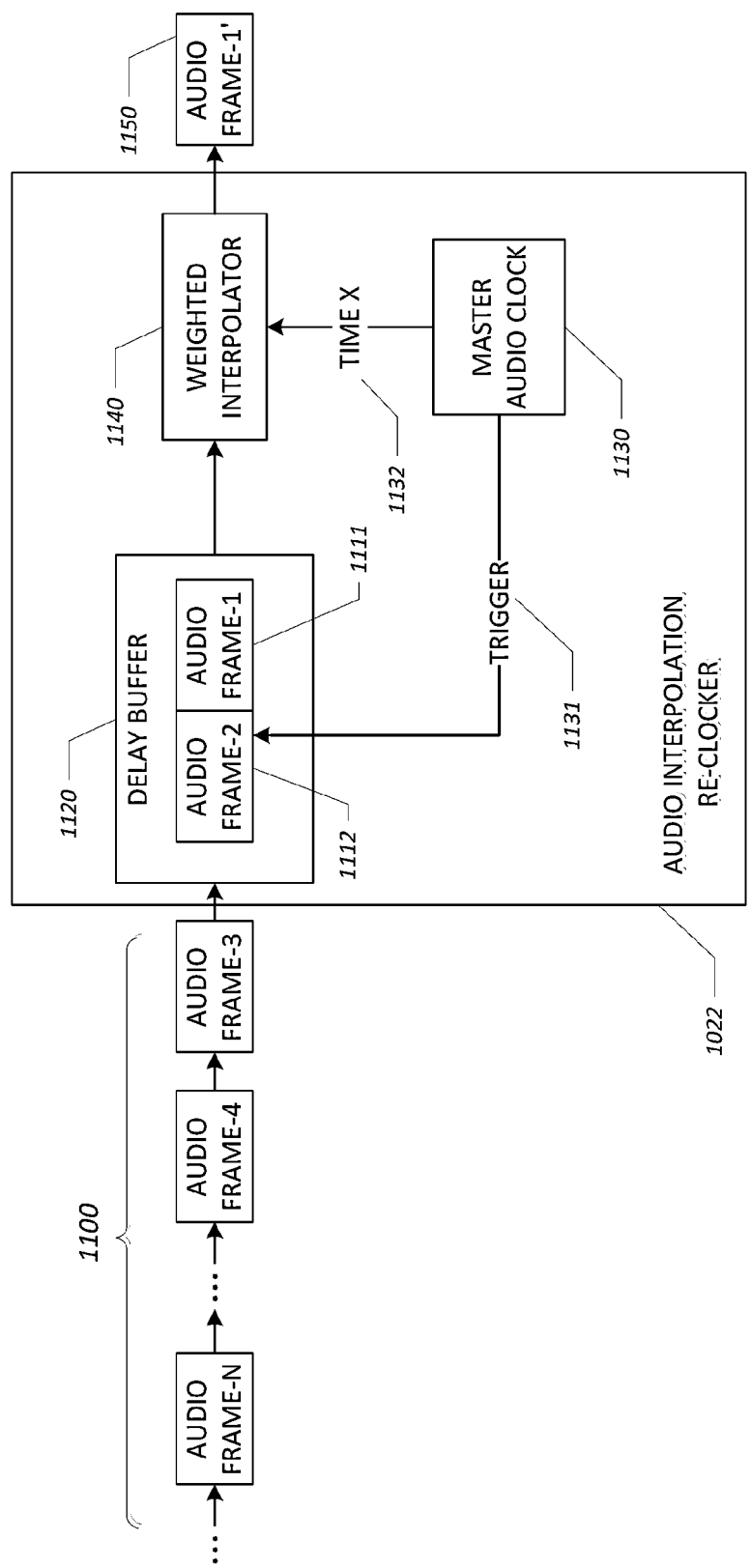
FIG. 11 is a block diagram that illustrates interpolation of audio frames by an audio interpolation reclocker.

FIG. 11 illustrates interpolation by an audio interpolation reclocker 1022. The depacketizer 1020b sends audio frame sequence 1100 to the interpolation reclocker 1022. Each audio frame spans an interval of time. Frames such as Frame-1 1111 and Frame-2 1112 are held in delay buffer 1120 until needed. The delay buffer 1120 may hold two or more frames. When a master audio clock 1130 determines that an interpolated audio frame 1150 that represents a particular time X 1132 should be output, it sends a trigger 1131 to identify the audio frames that need to be clocked into the output stream. A weighted interpolator 1140 performs a weighted average of some or all frames from the buffer, the weighting taking into account where time X 1132 is located relative to the start and end times of the frames.

Media Receiver: Output Reformatter

The output reformatter 1010b in FIG. 10 includes video, audio, and control logic modules. The video reformatter module accepts the 720p/60 YCbCr video format used in communications system and modifies video stream 1011b to the desired consumption format to be used by video destination 1001b. The audio reformatter module deconstructs the TDM stream in the communications system and creates an I2S or other appropriate format to be used by an audio destination 1002b. The control reformatter module formats the control data in the communications system to the desired standard based inter-bus protocols (e.g., I2C, SPI, UART). Output streams from the media transmitter 900 are labeled with exemplary protocols. Digital media and control streams are consumed by video destination 1001b, audio destinations 1002b, and control destinations 1003b of media appliance B 800b.

Power Over A/V Pipe

As illustrated by FIG. 9, CAT 6 cable 811 and similar communication systems support a method for carrying power originating from media appliance A 800a to media appliance B 800b. This method eliminates need for external power supplies for the secondary appliance. These systems also include an automated detection and protection scheme to prevent equipment damage associated with accidental connection to non-supported devices. Power at 24Vdc is supplied to differential pair 3 902c and differential pair 4 902d, and to the load 921 on the CAT 6 cable 811.

The detection and protection scheme may be described as follows. Switched DC levels which are compared to determine if media appliance A 800a (Source) is connected to a compatible load 921. Load detection and qualification is performed on differential pair 2 902b of CAT 6 cable 811. Disconnect detection is performed on differential pair 1 902a. Power is applied on differential pair 3 902c and differential pair 4 902d.

Prior to applying power 920 to differential pair 3 902c and differential pair 4 902d, a +5V probe voltage is switched onto one-half of differential pair 2 902b on the Source side. The other half of the differential pair 2 902b has a DC voltage comparator circuit connected on the Source side. The comparator determines whether an Ethernet device is connected to the Source. The probe voltage is current limited so, should an Ethernet device be connected, no damage will result to the Ethernet device. If an Ethernet device is connected, the Ethernet transformer will create a short between the two wires of differential pair 2 902b and create a specified voltage of known level for the comparator to detect. If an Ethernet device is present, system power will not be applied to differential pair 3 902c and differential pair 4 902d. If an Ethernet device was not detected, the +5V probe voltage is switched off and a higher +24V, current limited probe voltage is applied, again on differential pair 2 902b. Should an appropriate load be connected, this higher probe voltage will cause isolated back-to-back zener diodes located between the two differential lines of the load device to break down into conduction and create a known level which is detected by the sources comparator. System power can then be safely applied to differential pair 3 902c and differential pair 4 902d. Disconnect function operates on differential pair 1 902a. This is simply performed by equally energizing the differential lines on the load side with a logic level bias voltage of +3.3V and detecting with logic on the Source. Break the link connection and the load power goes away as well as the bias voltage on the differential pair 1 902a lines. Load power 920 would then be switched off at the Source and re-qualification of the link would take place as detailed above.

CONCLUSION

Of course, many variations of the above illustrative examples are possible within the scope of the invention. The present invention is, therefore, not limited to all the above details, as modifications and variations may be made without departing from the intent or scope of the invention. Consequently, the invention should be limited only by the following claims and equivalent constructions.

What is claimed is:

1. A system, comprising:
    a) a first bidirectional transceiver, which includes
        (i) a first digital media transmitter, coupled to an interface to a first differential wire pair of a cable;
        (ii) a first media receiver, coupled to an interface to a second differential wire pair of the cable;
        (iii) a first network transmitter, coupled to an interface to a third differential wire pair of the cable;
        (iv) a first network receiver, coupled to an interface to a fourth differential wire pair of the cable; and
        (v) a DC voltage comparator, which is used prior to applying power by the first bidirectional transceiver with a current-limited probe voltage switched onto a first half of the second differential wire pair connected on a source side, wherein the DC voltage comparator is connected on a second half of the second differential wire pair on the source side to determine whether an electrical load is connected to the third and fourth differential wire pairs by detecting a first known voltage resulting from the current-limited probe voltage switching if the electrical load is connected and detecting a second known voltage resulting from the current-limited probe voltage switching if the electrical load is not connected.

2. The system of claim 1, further comprising:
    b) a second bidirectional transceiver, which includes
        (i) a second digital media transmitter;
        (ii) a second digital media receiver;
        (iii) a second network transmitter; and
        (iv) a second network receiver,
    c) the cable, wherein
        (i) the first differential wire pair is coupled to the second digital media receiver;
        (ii) the second differential wire pair is coupled to the second digital media transmitter;
        (iii) the third differential wire pair is coupled to the second network receiver; and
        (iv) the fourth differential wire pair is coupled to the second network transmitter.

3. The system of claim 2, comprising:
    d) a power supply, electrically coupled in the first bidirectional transceiver to the third and fourth differential wire pairs; and
    e) a load, electrically coupled in the second bidirectional transceiver to the third and fourth differential wire pairs, and powered by the power supply.

4. The system of claim 3, wherein the cable is CAT 5, CAT 6, or CAT 7 cable.

5. The system of claim 2, wherein the first differential wire pair is used to detect a disconnect of a device previously connected to the second bidirectional transceiver.

6. The system of claim 1, further comprising:
    b) a first media device that
        (i) receives a first digital audio stream through a first interface and a first digital video stream through a second interface,
        (ii) combines the first digital audio stream and the first digital video stream into a first media stream, wherein the first digital audio stream and the first digital video stream are unencoded;
        (iii) transmits the first media stream using the first digital media transmitter in uncompressed form in real-time.

7. The system of claim 6, wherein, after combining the first digital audio stream and the first digital video stream, the first media device encodes the first media stream using SerDes encoding.

8. The system of claim 6, further comprising:
    c) an assembler/scheduler, in the first media device, that
        (i) establishes a priority ordering among input data types, wherein the input data types include audio data from the first digital audio stream, and video data from the first digital video stream, and
        (ii) inserts the input data types into the first media stream, sequenced according to the priority ordering on a bandwidth-available basis.

9. The system of claim 8, wherein a data of a given type is entered into the first media stream only when data of types having higher priority are not available for insertion.

10. The system of claim 8, wherein the input data types further include control information, which pertains to control and status of the system.

11. The system of claim 6, further comprising;
    c) a second media device that
        (i) includes a second bidirectional transceiver, and
        (ii) receives the first media stream using a second media receiver, within the second bidirectional transceiver; and
    d) assembler/scheduler logic, within the second media device, that
        (i) extracts data from the first media stream,
        (ii) separates the data according to data type, the data types including an audio data and video data,
        (iii) synchronizes the audio data with the video data, and
        (iv) after synchronization, creates a second audio stream from the audio data, and a second video stream from the video data.

12. The system of claim 11, wherein synchronizing audio data with video data uses interpolation in time of adjacent frames.

13. The system of claim 1, wherein the DC voltage comparator is further used by the first bidirectional transceiver to determine whether a device connected to the third and fourth differential wire pairs is supported, thereby protecting equipment from load damage.

14. The system of claim 13, wherein load detection and determination of whether a device is supported are performed using the first and second differential wire pairs.

15. A media transmitter apparatus, comprising:
a) a video source interface and an audio source interface;
b) input formatter logic, which includes
   (i) logic that reformats a real-time digital video stream received through the video source interface into a first video stream in a predetermined video format, and
   (ii) logic that reformats a real-time digital audio stream received through the audio source interface into a first audio stream in a predetermined audio format;
c) packetizer logic, which creates packets from the first audio stream and the first video stream, a plurality of the audio packets and a plurality of the video packets each having a header that includes metadata. regarding the respective packet, wherein the metadata specifies a source of the respective stream specifying a resource other than the media transmitter apparatus, a stream destination specifying a far-end media appliance, and a description of media type;
d) input adaptive rate multiplexer logic, which inserts the packets into a first media stream, sequencing the packets according to a packet prioritization scheme, wherein the first media stream contains at least one control side-band channel comprising, control data packets;
e) a cable Interface;
f) transport logic, which encodes the first media stream into a second media stream, and transmits the second media stream through the cable interface; and
g) an adaptive rate controller communicatively coupled to a receiving adaptive rate controller and configured to regulate transmission speed of the second media stream to correct at least one error condition determined based on the control side-band channel control data packets.

16. The media transmitter apparatus of claim 15, wherein audio information from the audio source interface and video information from the video source interface are in uncompressed form in the second media stream.

17. The media transmitter apparatus of claim 15, further comprising:
a control source interface;
wherein the second media stream includes a representation of control information that is received through the control source interface.

18. The media transmitter apparatus of claim 15, further comprising:
a protocol control interface, through which the media transmitter apparatus receives requests to modify a rate at which the media transmitter apparatus transmits packets through the cable interface.

19. The media transmitter apparatus of claim 15, wherein the input adaptive rate multiplexer logic, upon detecting a period of lower bandwidth of high priority packets, injects a lower priority packet into the sequence of the packets.

20. The media transmitter apparatus of claim 19, wherein the high priority packets include audio packets.

21. The media transmitter apparatus of claim 19, wherein low priority packets include control packets.

22. The media transmitter apparatus of claim 15, wherein the metadata specifies a source and a destination for the respective stream.

23. The media transmitter apparatus of claim 22, wherein the metadata further specifies a media type for the respective stream.

24. The media transmitter apparatus of claim 22, wherein the metadata further specifies a format for the respective stream.

25. The media transmitter apparatus of claim 22, wherein the metadata further specifies a size for the respective stream.

26. The media transmitter apparatus of claim 22, wherein the metadata further specifies handshaking and data validity information.

27. The media transmitter apparatus of claim 22, wherein the input adaptive rate multiplexer logic, upon detecting a period of lower bandwidth of high priority packets, injects a lower priority packet into the sequence of the packets.

28. The media transmitter apparatus of claim 15, wherein the adaptive rate controller prevents overflow conditions, monitors error conditions, and triggers retries of transmissions.

29. The media transmitter apparatus of claim 15, wherein the input adaptive rate multiplexer logic maintains real-time transmission by dropping at least one packet.

30. The media transmitter apparatus of claim 15, wherein the metadata further includes a destination for the respective stream at a target appliance external to the media transmitter apparatus.

31. The media transmitter apparatus of claim 15, wherein the metadata further includes a media format and a size.

32. A system, comprising:
a) a media receiver apparatus, including
   (i) a cable interface;
   (ii) transport logic, which receives a first media stream, in uncompressed form in real-time, through the cable interface, and decodes the first media stream into a second media stream, wherein the first media stream contains at least one control side-band channel comprising control data packets;
   (iii) output adaptive rate multiplexer logic, which removes packets from the second media stream;
   (iv) depacketizer logic, which removes headers that contain packet metadata from packets, and creates audio frames, video frames, and system control information, wherein the metadata for plurality of audio packets, video packets, and system control packets each contain a stream source specifying a resource other than a media transmitter from which the respective packet was received, a stream destination specifying a far-end media appliance, a size, and a description of media type;
   (v) reclocker logic, which synchronizes the audio and video frames using header metadata, and creates a first audio stream in a predetermined audio format, and a first video stream in a predetermined video format;
   (vi) output formatter logic, which reformats the first audio stream through an audio output interface in real-time, and reformats the first video stream through a video output interface in real-time; and
   (vii) adaptive rate controller logic in electrical communication with a transmitting rate controller and configured to regulate transmission speed of the first media stream to correct at least one error condition determined based on the control sideband channel control data packets.

33. The system of claim 32, the media receiver apparatus further including
a control destination interface, through which the output formatter logic sends a representation of system control information contained in the first media stream.

34. The system of claim 32, the media receiver apparatus further including a protocol control interface, through which the media receiver apparatus transmits a request to modify a current rate at which the media transmitter is receiving packets through the cable interface.

35. The system of claim 34, wherein the request is triggered by a determination that data in a buffer has exceeded a certain amount.

36. The system of claim 34, further comprising:
b) a cable, coupled to the cable interface of the media receiver apparatus;
c) a media transmitter apparatus, to which the cable is coupled, that modifies a current rate at which media transmitter transmits packets through the cable in response to the request.

* * * * *